(12) United States Patent
Bailey

(10) Patent No.: US 6,956,413 B2
(45) Date of Patent: Oct. 18, 2005

(54) RAMP GENERATOR FOR IMAGE SENSOR ADC

(75) Inventor: Toby Bailey, Edinburgh (GB)

(73) Assignee: STMicroelectronics Ltd., Buckinghamshire (GB)

( * ) Notice: Subject to any disclaimer, the term of this patent is extended or adjusted under 35 U.S.C. 154(b) by 331 days.

(21) Appl. No.: 10/254,443

(22) Filed: Sep. 25, 2002

(65) Prior Publication Data

US 2003/0071666 A1    Apr. 17, 2003

(30) Foreign Application Priority Data

Sep. 28, 2001  (EP) .................................. 01308309

(51) Int. Cl.⁷ ............................................. H03K 4/06
(52) U.S. Cl. ....................... 327/131; 327/170; 327/538
(58) Field of Search ................................ 327/131, 132, 327/133, 134, 170, 538; 324/770, 753, 763; 341/162, 118

(56) References Cited

U.S. PATENT DOCUMENTS

| | | | |
|---|---|---|---|
| 4,447,747 A | 5/1984 | LaPotin | 307/529 |
| 5,945,870 A | 8/1999 | Chu et al. | 327/536 |
| 6,495,997 B2 * | 12/2002 | Hall et al. | 323/316 |
| 6,518,910 B2 * | 2/2003 | Sakuragi et al. | 341/162 |
| 6,525,556 B2 * | 2/2003 | Matsueda | 324/770 |
| 6,677,809 B2 * | 1/2004 | Perque et al. | 327/541 |
| 6,712,271 B2 * | 3/2004 | Bianchi | 235/462.25 |

FOREIGN PATENT DOCUMENTS

| | | | | |
|---|---|---|---|---|
| EP | 0217224 | 4/1987 | | H03M 1/68 |
| EP | 0325378 | 7/1989 | | H03M 1/78 |

\* cited by examiner

*Primary Examiner*—Linh My Nguyen
(74) *Attorney, Agent, or Firm*—Lisa K. Jorgenson; Allen, Dyer, Doppelt, Milbrath & Gilchrist, P.A.

(57) ABSTRACT

A ramp generator includes a resistance ladder supplied with a constant current. Switches are closed in sequence by a shift register to provide a stepped ramp output. The constant current is controlled by referencing an on-chip bandgap voltage that is used as an input to a feedback circuit controlling current through a reference resistor ladder.

29 Claims, 5 Drawing Sheets

RAMP GENERATOR FOR IMAGE SENSOR ADC

FIELD OF THE INVENTION

The present invention relates to image sensors, and in particular, to a ramp generator and to an analog-to-digital converter (ADC) including a ramp generator.

BACKGROUND OF THE INVENTION

CMOS image sensors use an ADC arrangement in which the voltage of each pixel is compared with a ramp voltage. At the point where the ramp voltage equals the pixel voltage, a comparator latches a digital count value into memory. In this architecture, the resolution of the ADC is directly related to the resolution and linearity of the ramp generation circuitry.

Known ramp generators using ADCs, switched capacitor integrators, charge pumps and current into a capacitor suffer from a number of problems. These problems include offsets, achieving the necessary gain within the time constants required for settling, area and power inefficiency, non-monotonicity and process/temperature dependence.

SUMMARY OF THE INVENTION

In view of the foregoing background, an object of the present invention is to provide a ramp generator for an ADC that is part of an image sensor while mitigating the above noted problems.

This and other objects, advantages and features in accordance with the present invention are provided by a ramp generator comprising a resistance ladder formed by a number of resistance elements connected in series, a current source arranged to pass a controlled current through the resistance ladder, and a voltage output. A plurality of switches are operable to connect the voltage output to points or nodes on the resistance ladder between the resistance elements, and switch control means for closing at least some of the switches in a predetermined sequence.

Another aspect of the present invention is directed to an analog-to-digital converter incorporating the above described ramp generator. Yet another aspect of the present invention is directed to a solid state image sensor utilizing the analog-to-digital converter.

BRIEF DESCRIPTION OF THE DRAWINGS

Embodiments of the invention will now be described, by way of example only, with reference to the drawings, in which.

DETAILED DESCRIPTION OF THE PREFERRED EMBODIMENTS

Figure 1:
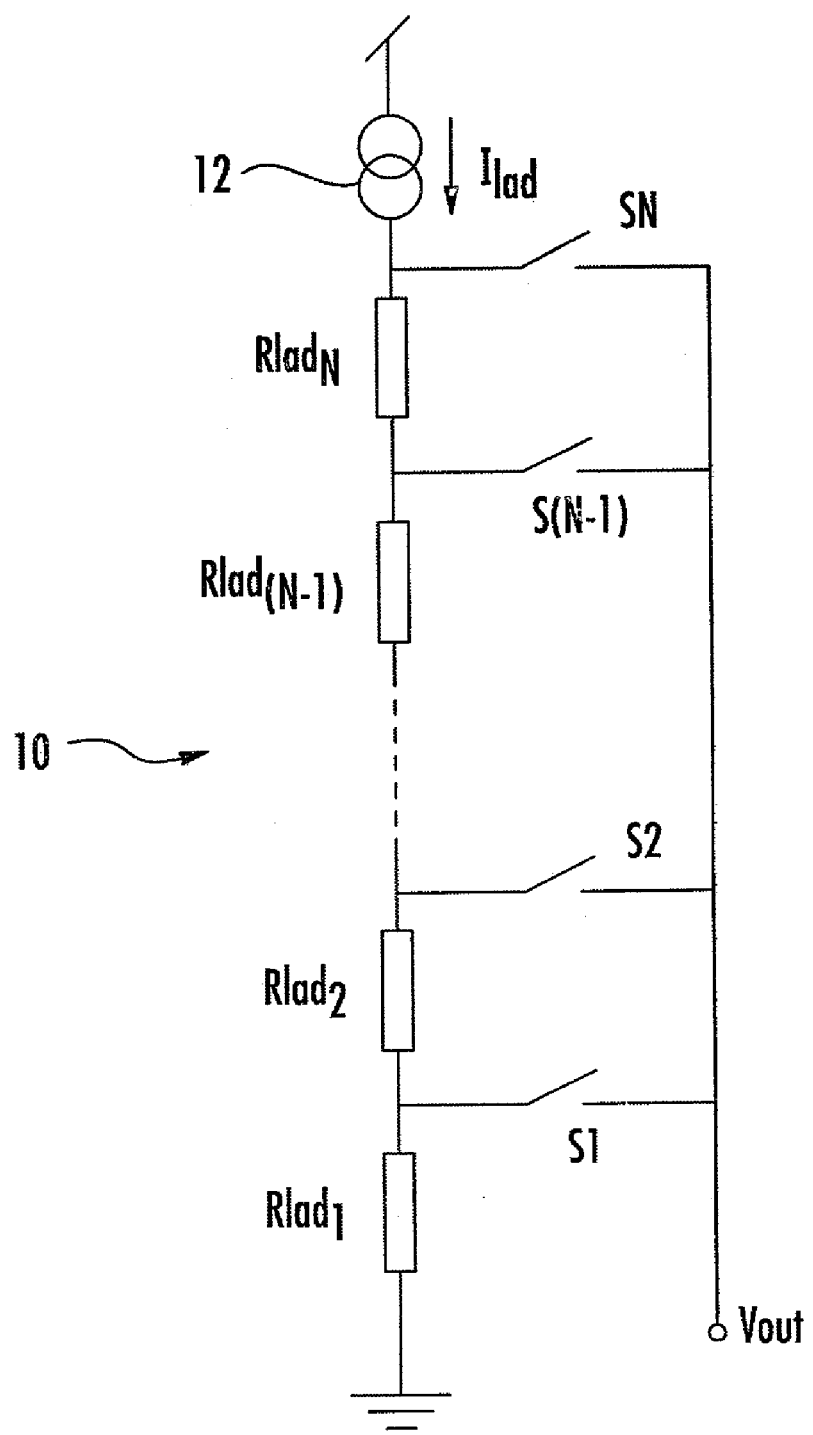
FIG. 1 is a schematic diagram of a resistance ladder in accordance with the present invention.

Referring to FIG. 1, a resistance ladder 10 is formed by a series of resistors Rlad1 through RladN. The resistance ladder 10 is supplied with a constant current Ilad by a constant current source 12. An output Vout can be tapped from each point or node along the resistance ladder 10 by operation of switches S1 through SN.

By operating the switches S sequentially, with only one switch being closed at a time, a stepped ramp voltage will be obtained at the output Vout. If all the resistors Rlad have the same value Runit, then $$Vout = N * Runit * Ilad$$

This arrangement gives a considerable degree of flexibility. The degree of granularity (the number of voltage steps in the ramp) can be chosen, which is typically up to a 12 bit resolution. A lower resolution can be chosen by operating only selected switches, for example, only the first, third, fifth and so on. Conversely, resolution can be increased by operating two switches simultaneously and interpolating to find an intermediate level.

Figure 2:
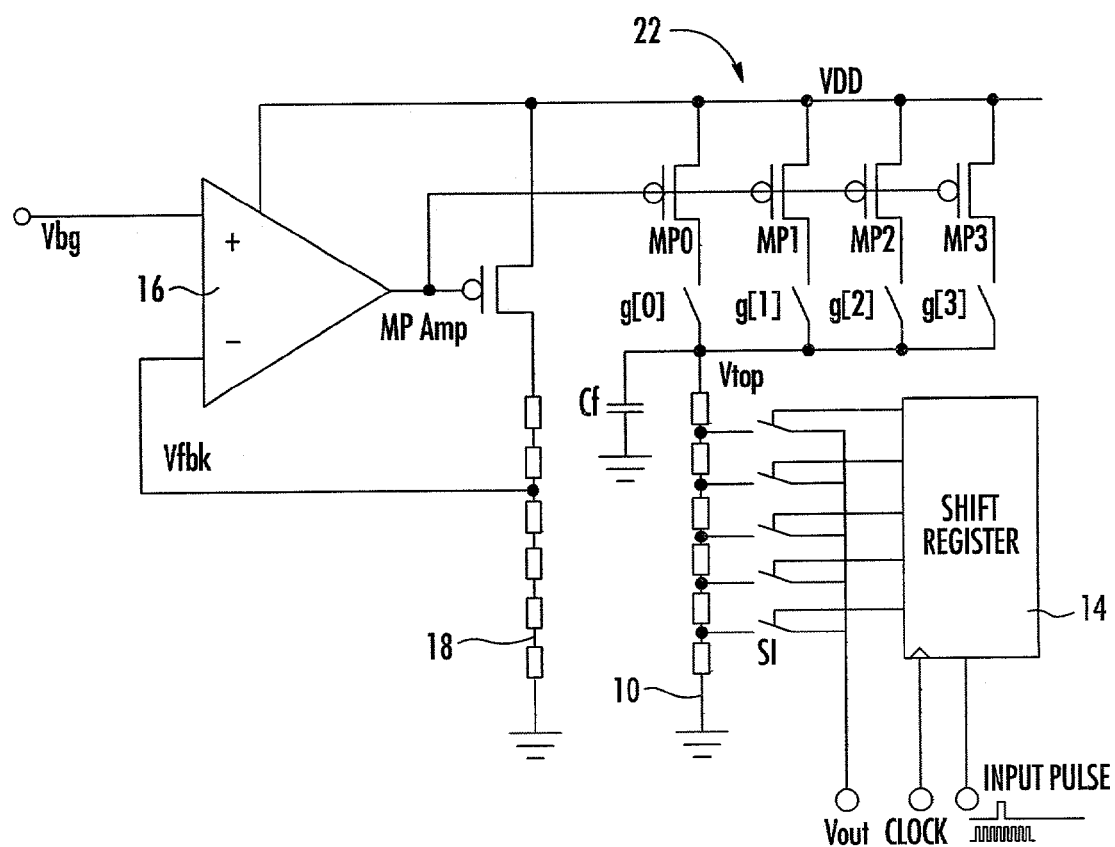
FIG. 2 is a more detailed schematic diagram showing one embodiment of the present invention.

Turning to FIG. 2, in this embodiment the switches S are operated by a shift register 14 which shifts a single input pulse at a rate set by an incoming clock pulse such that only one output is high at any time. It will be understood that the circuit of FIG. 2 is typically part of a much larger integrated circuit, such as an image sensor circuit. The shift register 14 is preferably formed as a number of hybrid shift register elements in the integrated circuit.

In a practical embodiment it is possible to provide a resistance ladder 10 with sufficient elements for a 10 bit (1024 step) resolution, which can also be used by suitable shift register clocking schemes to generate a 9 bit (512 step), 8 bit (256 step), or 7 bit (128 step) ramp. Interpolation allows generation of an 11 bit (2048 step) ramp without increased complexity. By asserting two consecutive select signals simultaneously, two neighboring switches S are enabled. The output voltage is then the median of the ramp voltages, assuming the switches have identical resistance. The advantage of such an interpolation is that the silicon overhead for any given maximum resolution can be effectively halved.

The accuracy of the ramp voltage generation depends on the accuracy of the current Ilad. A stable on-chip bandgap voltage Vbg is used as a reference. This voltage is largely independent of process variations and temperature. The bandgap voltage Vbg is used as an input to a high-gain amplifier 16. A feedback voltage Vfbk is taken from a reference resistance ladder 18. The feedback ensures that Vfbk is equal to the bandgap voltage Vbg, and thus the current Iref through the reference resistance ladder 18 equals Vbg/Rref. Rref is the total resistance of the reference resistance ladder 18.

This current is forced through a PMOS transistor MPamp which is matched to an array of similar PMOS transistors MP0, MP1 . . . providing a current 22. The transistors MP0, MP1 . . . have the same gate source voltage as the transistor MPamp, and thus the reference resistance current is mirrored to the ramp resistance ladder 10.

The ratio of transistor sizes between MPamp and the transistors MP0, MP1 . . . can be used to scale the current in the ramp resistance ladder 10. Note that the voltage Vtop at the top of the ramp ladder 10 is equal to Vbg/Rref×Rramp×M, where Rramp is the total resistance of the ramp ladder 10 and M is the ratio of transistors between MPamp and the PMOS DAC 22. If Rref and Rramp are closely matched by careful layout techniques (close proximity and a common centroid) then their ratio can be assumed to be constant. The ramp resistance ladder 10 maximum voltage Vtop is then Vbg*M and M can be selected by the digital control signals g[3:0]. The ramp range is then dependent on careful matching of the PMOS transistors of the current 22 and of the PMOS transistor MPamp by standard analog techniques.

Power supply rejection of the system is dependent on a good power supply rejection of the amplifier 16. The power supply rejection and thermal noise can be improved by placing a large capacitor Cf at the top of the ramp resistance ladder 10. Note that the architecture of FIG. 2 does not require an output buffer provided that the ladder current Ilad is sufficient to drive the load. For on-chip capacitive loads, this is easily the case for typical values of the ladder resistance, the current and the voltage range. An output buffer may have detrimental effects on the power supply rejection and the output swing.

Figure 3:
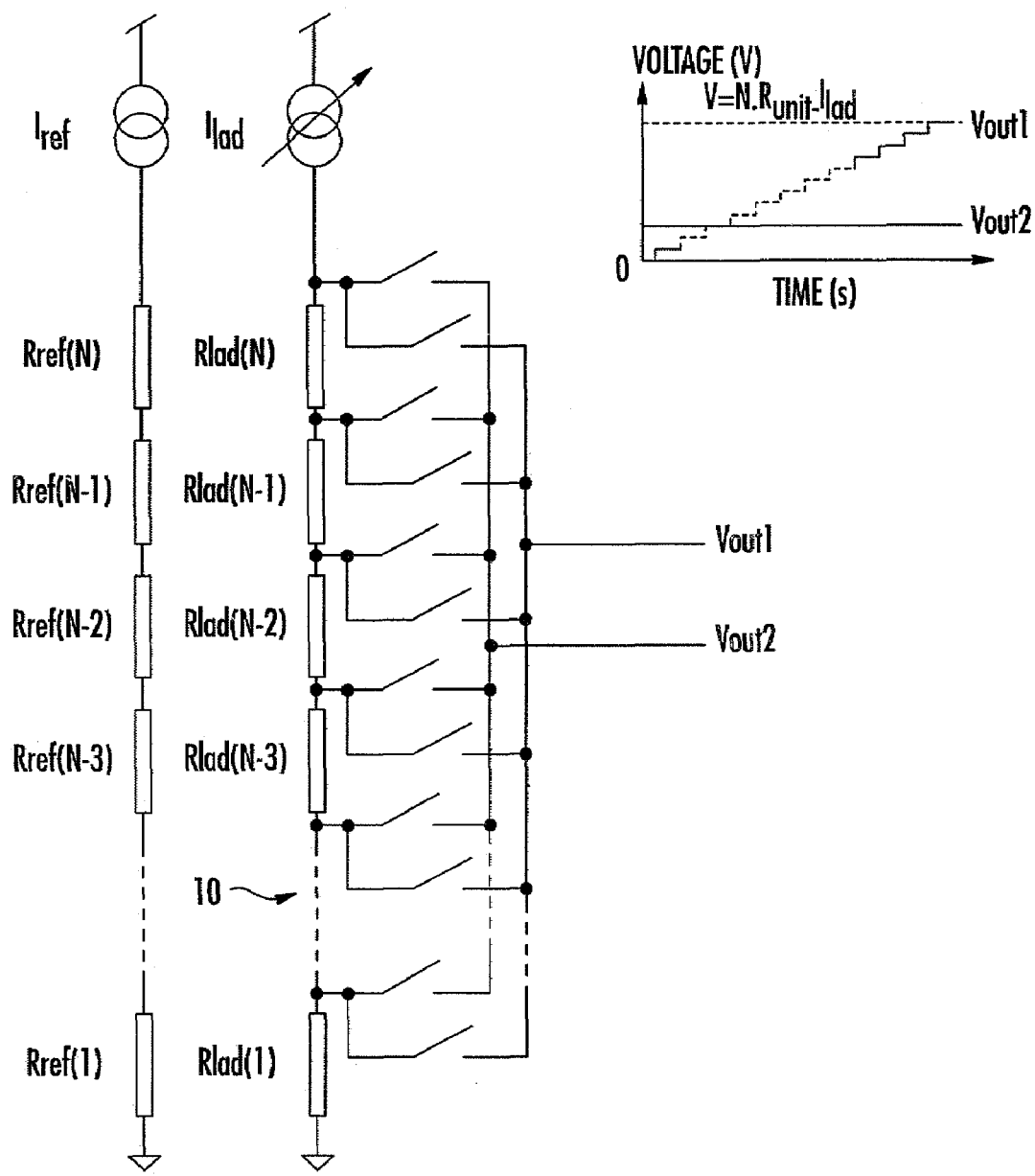
FIG. 3 is a schematic diagram showing a variation of the embodiment illustrated in FIG. 2.

FIG. 3 shows a modified embodiment in which a differential ramp voltage is generated by injecting a controlled variable current Ilad into a resistance ladder 10 comprising unit resistors. Two outputs, Vout1 and Vout2, are provided from the ramp resistance ladder 10. Switches on Vout1 are activated in sequence to produce the ramp voltage at the output, while switches on Vout2 are selected by a multiplexer (not shown) to provide a well defined offset voltage. The granularity (number of unit voltage steps) between the selectable offset voltages can be arbitrarily chosen by tapping the ladder at selected nodes. The differential output voltage (Vout1−Vout2) has good supply noise rejection since it is generated from a single ladder with a common ground potential. A selectable offset voltage is useful to compensate for other imaging system offsets when the ramp generator forms part of an imaging system.

Figure 4:
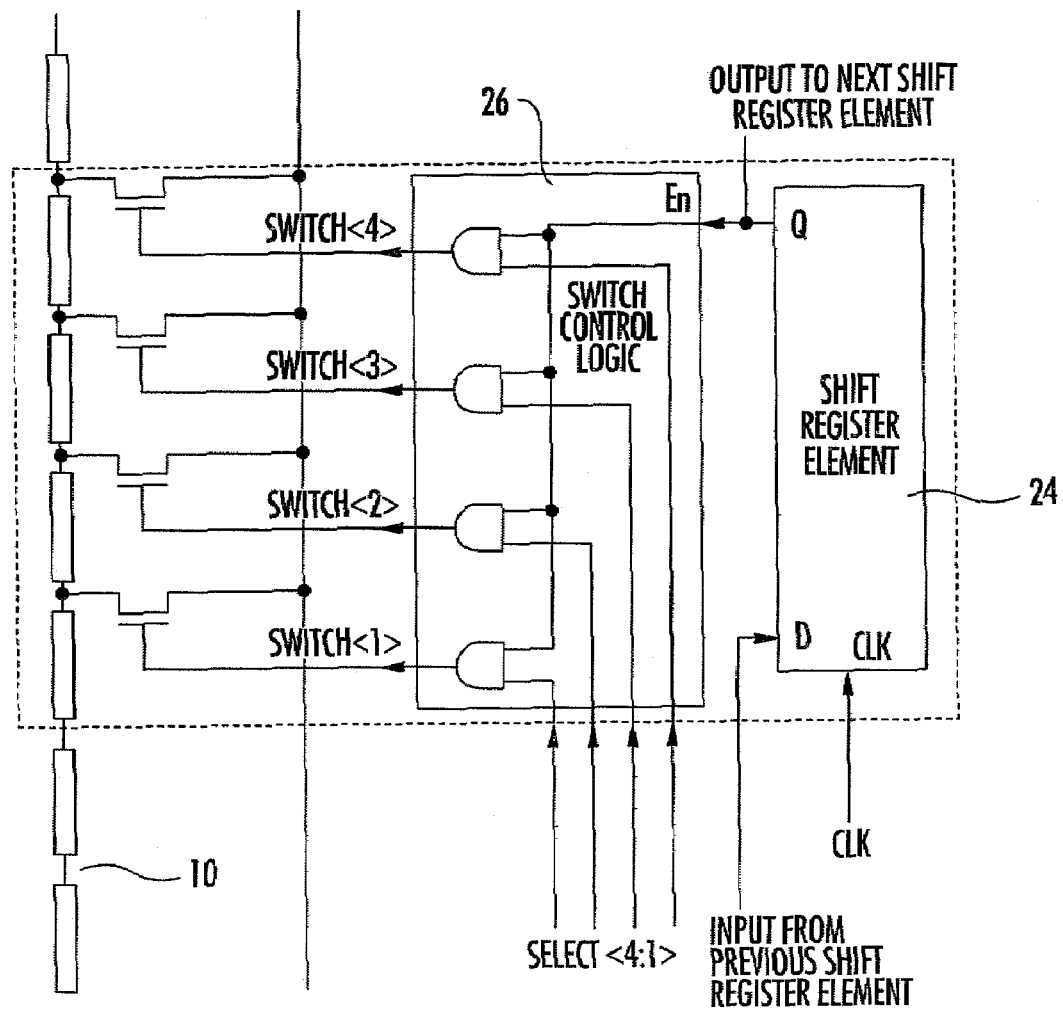
FIG. 4 is a detailed schematic diagram of a hybrid shift register arrangement for use in the embodiment illustrated in FIG. 2.

FIG. 4 illustrates a preferred method of addressing the switches on the resistor ladder. This can be efficiently performed with a hybrid shift register which comprises one shift register element 24 for an L number (in this example four) of resistor ladder elements. A multiplexer 26 takes the output of the shift register 24 as an enable signal En which, when combined with select signals Select<L:1>, selects one of the ladder segment outputs. The choice of L is selected to reduce or minimize the layout area of the hybrid shift element and to reduce the clock frequency at which the shift register operates.

When a pulse is introduced into the first element of the shift register, the first bank of resistors is selected. The asserted output of the shift register element combined with the application of a particular select signal (select<4:1>) addresses an individual resistor element.

The control logic provides the following functionality: (i) activate each switch in turn; or (ii) activate every $2^N$ switch in turn, where N is an integer. The number of unit steps generated for each value of N is then the number of unit resistors in the ladder divided by $2^N$; or (iii) activate two neighboring switches together. The output voltage is an interpolation of the voltages at either end of the relevant resistor. This provides an in-between voltage step and doubles the resolution.

The propagation of the pulse down the shift register when appropriately clocked completes the sequence, and selects each bank of resistors in turn. The select signals address the individual resistors in each bank in the required fashion.

Figure 5:
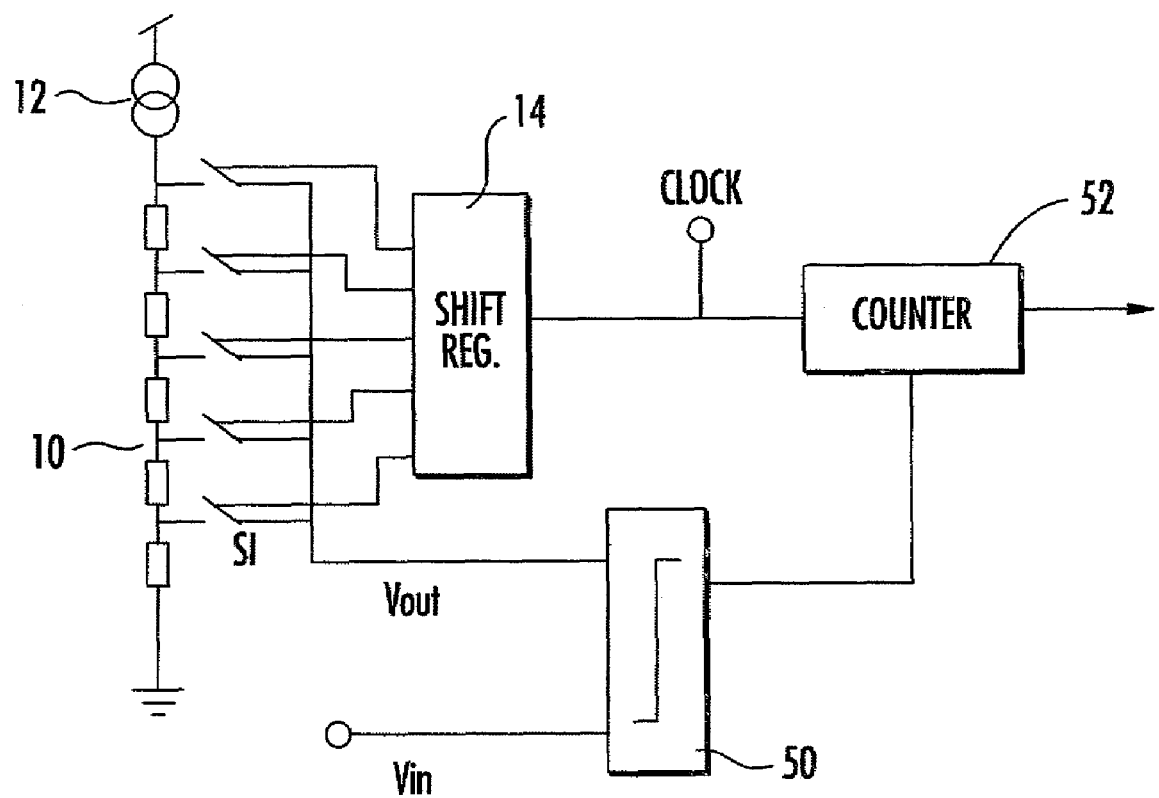
FIG. 5 is a block diagram of an analog-to-digital converter using a ramp generator in accordance with the present invention.

FIG. 5 illustrates schematically the use of the ramp generator of the present invention in an ADC. The incoming analog signal to be converted is applied to one input of a latching comparator 50. The Vout signal from the ramp generator is applied to the other input. The system clock pulses are applied to a counter 52. When Vout equals the analog signal, the latching comparator 50 changes state, and enables the contents of the counter 52 to be output as a digital representation of the analog signal.

Embodiments of the invention provide a number of benefits:

(1) Generation of a ground-referenced differential ramp is independent of supply, temperature and processes;

(2) Independence of ramp amplitude from frequency;

(3) Accurate gain and offset programmability;

(4) Inherently monotonic;

(5) Programmable resolution through subsampling and interpolation;

(6) Efficient use of area and power, scalability with process geometry; and (7) High power supply rejection and low noise.

The ramp generator of the present invention is particularly useful in an ADC circuit but may be used in other applications. Moreover, the ADC circuit may form part of an image sensor chip, but is not limited to such use.

That which is claimed is:

1. A ramp generator comprising:
a plurality of resistance elements connected together in series to form a resistance ladder, with a node between each of the resistance elements;
a current source connected to said resistance ladder for passing a controlled current therethrough;
a plurality of switches connected between the nodes of said resistance ladder and a voltage output; and
switch control means for closing at least some of said plurality of switches in a predetermined sequence, said switch control means comprising a shift register receiving a clock signal and including
a plurality of shift register elements, each shift register element for a predetermined number of switches, and
a plurality of multiplexers connected to said plurality of shift register elements, each respective multiplexer for connecting a corresponding switch register element to its predetermined number of switches.

2. A ramp generator according to claim 1, wherein said shift register selectively switches each switch based upon the predetermined sequence.

3. A ramp generator according to claim 1, wherein said shift register selectively switches every nth switch based upon the predetermined sequence, with n being an integer.

4. A ramp generator according to claim 1, wherein said plurality of switches are connected to the nodes of said resistance ladder so that there are a pair of switches connected to each node; and wherein said shift register selectively switches single switches or pairs of switches based upon the predetermined sequence.

5. A ramp generator according to claim 1, wherein the ramp generator is configured as an integrated circuit.

6. A ramp generator according to claim 5, wherein said current source is controlled by referencing a bandgap voltage of the integrated circuit.

7. A ramp generator according to claim 6, further comprising a reference resistance ladder connected to said resistance ladder; and wherein the bandgap voltage is compared with a feedback signal from said reference resistance ladder for providing a constant reference current through said reference resistance ladder.

8. A ramp generator according to claim 7, further comprising:
  a first PMOS transistor connected in series with said reference resistance ladder, with the constant reference current for said reference resistance ladder flowing through said first PMOS transistor; and
  a plurality of matching PMOS transistors connected to a same gate-source voltage as said first PMOS transistor, and being selectively switched for supplying the constant current to said resistance ladder.

9. An analog-to-digital converter comprising:
  a ramp generator comprising
    a plurality of resistance elements connected together in series with a node between each of the resistance elements,
    a current source connected to said plurality of resistance elements for passing a controlled current therethrough,
    a plurality of switches connected between the nodes of said plurality of resistance elements and a voltage output, and
    a switch controller for closing at least some of said plurality of switches in a predetermined sequence, said switch controller comprising a shift register including
      a plurality of shift register elements, each shift register element for a predetermined number of switches, and
      a plurality of multiplexers connected to said plurality of shift register elements, each respective multiplexer for connecting a corresponding switch register element to its predetermined number of switches; and
  comparing means having a first input for receiving a voltage at the voltage output of said ramp generator and a second input for receiving an analog voltage, said comparing means for comparing the two voltages.

10. An analog-to-digital converter according claim 9, wherein said shift register selectively switches each switch based upon the predetermined sequence.

11. An analog-to-digital converter according to claim 9, wherein said shift register selectively switches every nth switch based upon the predetermined sequence, with n being an integer.

12. An analog-to-digital converter according to claim 9, wherein said plurality of switches are connected to the nodes of said plurality of resistance elements so that there are a pair of switches connected to each node, and wherein said shift register selectively switches single switches or pairs of switches based upon the predetermined sequence.

13. An analog-to-digital converter according to claim 9, wherein the analog-to-digital converter is configured as an integrated circuit; and wherein said current source is controlled by referencing a bandgap voltage of the integrated circuit.

14. An analog-to-digital converter according to claim 13, wherein said ramp generator further comprises a second plurality of resistance elements connected to said plurality of resistance elements; and wherein the bandgap voltage is compared with a feedback signal from said second plurality of resistance elements for providing a constant reference current through said plurality of resistance elements.

15. An analog-to-digital converter according to claim 14, wherein said ramp generator further comprises:
  a first PMOS transistor connected in series with said second plurality of resistance elements, with the constant reference current for said second plurality of resistance elements flowing through said first PMOS transistor; and
  a plurality of matching PMDS transistors connected to a same gate-source voltage as said first PNOS transistor, and being selectively switched for supplying the constant current to said plurality of resistance elements.

16. An image sensor comprising:
  at least one analog-to-digital converter for converting pixel voltage signals to digital signals, said at least one analog-to-digital converter comprising
    a ramp generator comprising
      a plurality of resistance elements connected together in series with a node between each of the resistance elements,
      a current source connected to said plurality of resistance elements for passing a controlled current therethrough,
      a plurality of switches connected between the nodes of said plurality of resistance elements and a voltage output, and
      a switch controller for closing at least some of said plurality of switches in a predetermined sequence said switch controller comprising a shift register receiving a clock signal, said shift register including
        a plurality of shift register elements, each shift register element for a predetermined number of switches, and
        a plurality of multiplexers connected to said plurality of shift register elements, each respective multiplexer for connecting a corresponding switch register element to its predetermined number of switches; and
    a comparator having a first input for receiving a voltage at the voltage output of said ramp generator and a second input for receiving an analog voltage, said comparator for comparing the two voltages.

17. An image sensor according to claim 16, wherein said plurality of switches are connected to the nodes of said plurality of resistance elements so that there are a pair of switches connected to each node, and wherein said shift register selectively switches single switches or pairs of switches based upon the predetermined sequence.

18. An image sensor according to claim 16, wherein the image sensor is configured as an integrated circuit; and wherein said current source is controlled by referencing a bandgap voltage of the integrated circuit.

19. An image sensor according to claim 18, wherein said ramp generator further comprises a second plurality of resistance elements connected to said plurality of resistance elements; and wherein the bandgap voltage is compared with a feedback signal from said second plurality of resistance elements for providing a constant reference current through said second plurality of resistance elements.

20. An image sensor according to claim 19, wherein said ramp generator further comprises:
  a first PMOS transistor connected in series with said second plurality of resistance elements, with the constant reference current for said reference resistance ladder flowing through said first PMOS transistor; and
  a plurality of matching PMOS transistors connected to a same gate-source voltage as said first PMOS transistor, and being selectively switched for supplying the constant current to said plurality of resistance elements.

21. A method for operating a ramp generator comprising a plurality of resistance elements connected together in series with a node between each resistance element, & current source connected to the plurality of resistance elements, and a plurality of switches connected between the nodes and a voltage output, the method comprising;

providing a controlled current through the plurality of resistance elements; and closing at least some of the plurality of switches, with a switch register receiving a clock signal, in a predetermined sequence for providing a voltage at the voltage output, wherein the shift register comprises a plurality of shift register elements, each shift register element for a predetermined number of switches, and a plurality of multiplexers connected to the plurality of shift register elements, each respective multiplexer for connecting a corresponding switch register element to its predetermined number of switches.

22. A method according to claim 21, wherein the shift register selectively switches each switch based upon the predetermined sequence.

23. A method according to claim 21, wherein the shift register selectively switches every nth switch based upon the predetermined sequence, with n being an integer.

24. A method according to claim 21, wherein the plurality of switches are connected to the nodes of the plurality of resistance elements so that there are a pair of switches connected to each node; and wherein the shift register selectively switches single switches or pairs of switches based upon the predetermined sequence.

25. A method according to claim 21, wherein the ramp generator is configured as an integrated circuit; and wherein the current source is controlled by referencing a bandgap voltage of the integrated circuit.

26. A method according to claim 25, wherein the ramp generator further comprises a second plurality of resistance elements connected to the plurality of resistance elements; and further comprising comparing the bandgap voltage with a feedback signal from the second plurality of resistance elements for providing a constant reference current through the second plurality of resistance elements.

27. A method according to claim 26, wherein the ramp generator further comprises a first PMOS transistor connected in series with the second plurality of resistance elements, with the constant reference current for the second plurality of resistance elements flowing through the first PMOS transistor; and a plurality of matching PMOS transistors connected to a same gate-source voltage as the first PMOS transistor, and being selectively switched for supplying the constant current to the plurality of resistance elements.

28. A ramp generator comprising:

a resistance ladder including a plurality of resistance elements connected together with a node between each of the resistance elements;

a controlled current source connected to said resistance ladder;

a plurality of switches connected between the nodes of said resistance ladder and a voltage output; and a switch controller for operating said plurality of switches in a predetermined sequence, said switch controller comprising a shift register receiving a clock signal, wherein said shift register comprises a plurality of shift register elements, each shift register element for a predetermined number of switches, and a plurality of multiplexers connected to said plurality of shift register elements, each respective multiplexer for connecting a corresponding switch register element to its predetermined number of switches.

29. A ramp generator according to claim 28, wherein said plurality of switches are connected to the nodes of said resistance ladder so that there are a pair of switches connected to each node; and wherein said shift register selectively switches single switches or pairs of switches based upon the predetermined sequence.

* * * * *

UNITED STATES PATENT AND TRADEMARK OFFICE
CERTIFICATE OF CORRECTION

PATENT NO. : 6,956,413 B2  Page 1 of 1
APPLICATION NO. : 10/254443
DATED : October 18, 2005
INVENTOR(S) : Bailey It is certified that error appears in the above-identified patent and that said Letters Patent is hereby corrected as shown below:

| | |
|---|---|
| Cover Page, Section 53 | Insert -- Shen, Gain Switching Circuit, IBM Technical Disclosure Bulletin, vol. 10, no. 7, December 1967, page 1037, XP002192218 --. |
| Column 6, Line 4 | Delete: "PMDS"<br>Insert -- PMOS -- |
| Column 6, Line 5 | Delete: "PNOS"<br>Insert -- PMOS -- |
| Column 7, Line 1 | Delete: "&" |

Signed and Sealed this

Third Day of October, 2006

JON W. DUDAS
*Director of the United States Patent and Trademark Office*